(12) United States Patent
Yang et al.

(10) Patent No.: US 10,395,999 B1
(45) Date of Patent: Aug. 27, 2019

(54) METHOD FOR MONITORING FIN REMOVAL

(71) Applicant: UNITED MICROELECTRONICS CORP., Hsinchu (TW)

(72) Inventors: Cheng-Hao Yang, Changhua County (TW); En-Chiuan Liou, Tainan (TW); Hsiao-Lin Hsu, Yunlin County (TW); Tang-Chun Weng, Chiayi (TW); Chia-Ching Lin, Kaohsiung (TW); Yen-Pu Chen, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/981,053

(22) Filed: May 16, 2018

(30) Foreign Application Priority Data

Apr. 18, 2018 (TW) .............................. 107113147 A

(51) Int. Cl.
*H01L 21/308* (2006.01)
*H01L 27/02* (2006.01)
(Continued)

(52) U.S. Cl.
CPC .......... *H01L 22/30* (2013.01); *H01L 21/3086* (2013.01); *H01L 22/12* (2013.01); *H01L 27/0207* (2013.01); *H01L 29/66795* (2013.01)

(58) Field of Classification Search
CPC ..... H01L 21/823431; H01L 21/823821; H01L 21/845; H01L 21/033–0338; H01L 21/02642; H01L 21/027–0338; H01L 21/0465; H01L 21/266; H01L 21/308–3088; H01L 21/31056; H01L 21/31144; H01L 21/32; H01L 21/32139; H01L 21/426; H01L 21/467; H01L 21/469–47576; H01L 21/7688; H01L 27/0886; H01L 27/0924; H01L 27/10826; H01L 27/10879; H01L 27/1211; H01L 27/0207; H01L 29/41791; H01L 29/66795–66818; H01L 29/785–7856;
(Continued)

(56) References Cited

U.S. PATENT DOCUMENTS 7,202,148 B2 4/2007 Chen et al.
7,856,613 B1 12/2010 Weling et al.
(Continued)

*Primary Examiner* — Laura M Menz
*Assistant Examiner* — Candice Chan
(74) *Attorney, Agent, or Firm* — WPAT, PC

(57) ABSTRACT

A method for monitoring fin removal includes providing a substrate having a first region with first fins extending along a first direction and a second region with second fins extending along a second direction, wherein the first direction is perpendicular to the second direction; forming a material layer on the substrate to cover the first fins and the second fins; identically patterning the first fins and the second fins using a first pattern and a second pattern respectively for simultaneously removing parts of the first and second fins, thereby forming first fin features in the first region and second fin features in the second region, wherein the first pattern has a first dimension along the second direction, the second pattern has a second dimension along the second direction, and the second dimension is equal to the first dimension; and monitoring the first fin features using the second fin features.

15 Claims, 4 Drawing Sheets

(51) Int. Cl.
*H01L 21/66* (2006.01)
*H01L 29/66* (2006.01)

(58) Field of Classification Search
CPC ... H01L 2029/7857–7858; H01L 2924/13067; H01L 22/12; H01L 22/30
See application file for complete search history.

(56) References Cited

U.S. PATENT DOCUMENTS

| | | | |
|---|---|---|---|
| 8,142,986 B2 | 3/2012 | Sim et al. | |
| 8,881,066 B2 | 11/2014 | Shieh et al. | |
| 2010/0096719 A1* | 4/2010 | Lee | H01L 21/0332 |
| | | | 257/506 |
| 2017/0025284 A1* | 1/2017 | Kang | H01L 27/0207 |

* cited by examiner

METHOD FOR MONITORING FIN REMOVAL

This application claims the benefit of Taiwan application Serial No. 107113147, filed Apr. 18, 2018, the subject matter of which is incorporated herein by reference.

BACKGROUND

Technical Field

The disclosure relates in general to a method for monitoring fin removal, and more particularly to a method for monitoring the removal of the fins by forming a monitoring pattern.

Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. Generally, the layers and components (such as fins) with damages or unwanted residuals remained would have considerable effects on the electrical properties, and this is one of the important issues of the device for the manufacturers. For example, in a conventional process for fin removal, the fins are covered by a material layer before etching, so that the fin damage and/or the fin residuals would be occurred after etching the unwanted portions of the fins, thereby affecting the production yield of the semiconductor device.

SUMMARY

The disclosure is directed to a method for monitoring the fin removal by forming a monitoring pattern. According to the embodied method, the pattern accuracy of the fin removal can be quickly confirmed and corrected if needed, thereby effectively increasing the production yield of the semiconductor device in the application.

According to one aspect of the present disclosure, a method for monitoring fin removal is provided, comprising: providing a substrate at least having a first region with first fins extending along a first direction and a second region with second fins extending along a second direction, wherein the first direction is perpendicular to the second direction; forming a material layer on the substrate to cover the first fins and the second fins; identically patterning the first fins and the second fins using a first pattern and a second pattern on the material layer respectively for simultaneously removing parts of the first and second fins, thereby forming first fin features in the first region and second fin features in the second region, wherein the first pattern has a first dimension along the second direction, the second pattern has a second dimension along the second direction, and the second dimension is equal to the first dimension; and monitoring the first fin features using the second fin features.

Figure 1:
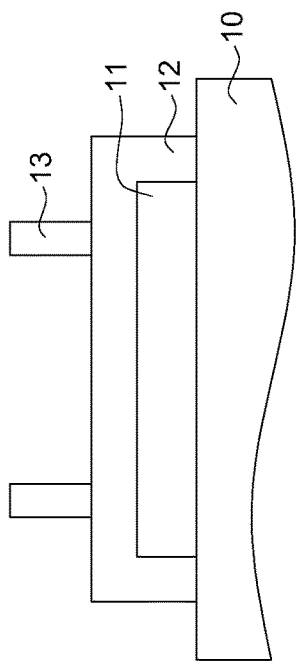
FIG. 1 is a cross-sectional view simply showing a fin of a semiconductor structure before fin-remove process.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the embodiment of the present disclosure, a method for monitoring the removal of the fins is provided, by forming a monitoring pattern using the fins positioned outside a target region. According to the embodiment, a fin-removing critical dimension for forming the target fin features in a target region can be checked in an easier way through a monitoring critical dimension of the second fin features in a region different from the target region. Thus, according to the embodied method, the pattern accuracy of the fin removal can be quickly confirmed and corrected if needed, which increases the production yield and saves the production cost of the semiconductor devices as manufactured.

Embodiments are provided hereinafter with reference to the accompanying drawings for describing the related procedures and configurations. For example, a semiconductor device having two regions with fins extending along the different directions is exemplified for illustrating monitoring of fin removal of an embodiment. However, the present disclosure is not limited thereto. It is noted that not all embodiments of the invention are shown. There may be other embodiments of the present disclosure which are not specifically illustrated. Modifications and variations can be made without departing from the spirit of the disclosure to meet the requirements of the practical applications. It is also important to point out that the illustrations may not necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements. Also, spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Thus, the terminology used herein is for the purpose of describing particular embodiments and is not intended to be limiting of the invention.

FIG. 1 is a cross-sectional view simply showing a fin of a semiconductor structure before fin-remove process. In a fin-remove process, undesired portions of the fins are removed such as by etching to produce the desired fin features. Typically, the fins are covered by a material layer before etching. As shown in FIG. 1, a substrate 10 having a fin 11 is covered by a material layer 12, and a photoresist (PR) pattern 13 can be provided on the material layer 12 for patterning the fin 11. However, the fins are covered by the material layer before patterning (ex: etching), it is incapable to catch the critical dimension (CD) of fin removal by a scanning electron microscopy for cutting the unwanted portions of the fins. If the fin-removing critical dimension (CD) is too large, the fin damage would be occurred. If the fin-removing critical dimension (CD) is too small, the residues of undesired portions of the fins would be remained. Therefore, after-etching-inspection critical dimension (AEI CD) is critical because the fin damage (caused by too large CD) and/or fin residue (caused by too small CD) would be the concerns in sites due to a worse overlay. According to the present disclosure, a method of monitoring the fin removal, particularly the fin-removing critical dimension (CD), for the fins positioned in a region (e.g. a cell region) is provided. The method of the embodiment can be applied by forming a monitoring pattern, which provides an easier way to check a fin-removing critical dimension (CD) for the target fin features in a target region (such as a first region). Then, the fin-removing critical dimension (CD) is compared with a monitoring critical dimension (CD) of the second fin features in a region different from the target region (such as a second region). Thus, the pattern accuracy of the fin removal for the target fins can be improved by applying the embodied method.

Figure 2:
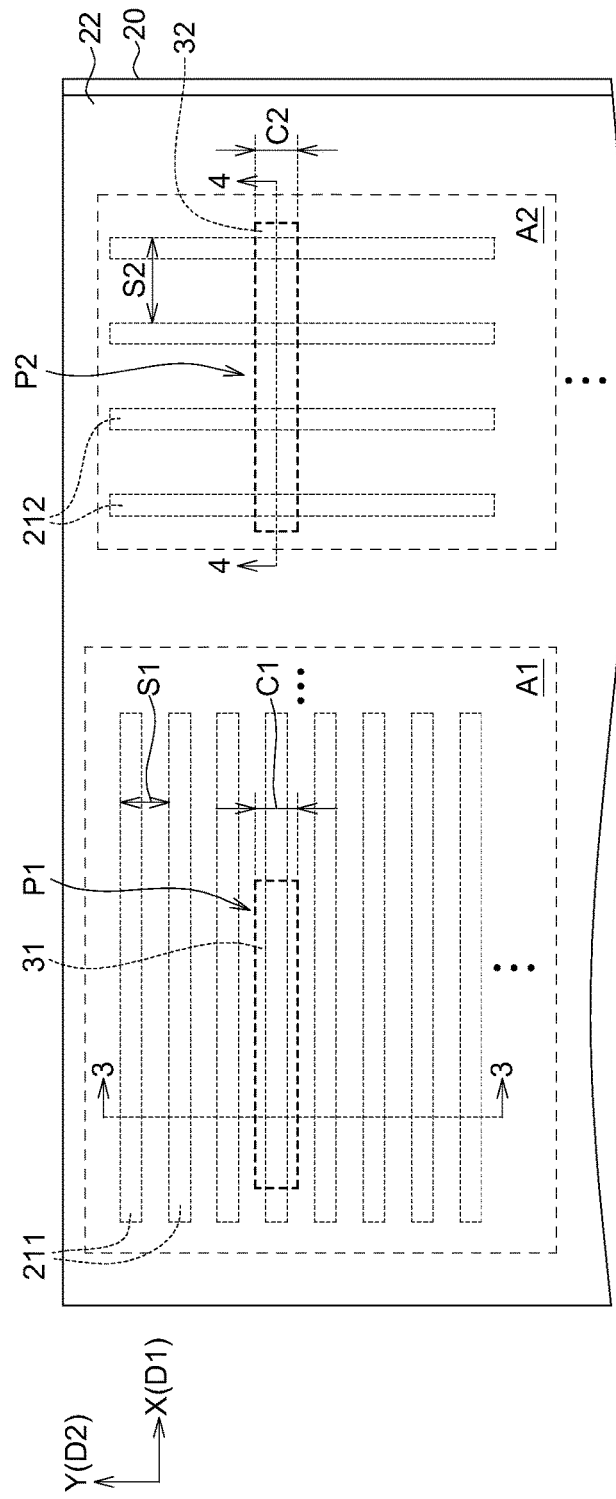
FIG. 2 is a top view schematically showing a semiconductor structure applied in a fin-remove process according to one exemplary embodiment of the disclosure.

In one embodiment, two different regions having fins extending along the different directions are selected, and one of the regions (e.g. a second region) is selected to form a monitoring pattern for monitoring the fin features in the other region (e.g. a first region). FIG. 2 is a top view schematically showing a semiconductor structure applied in a fin-remove process according to one exemplary embodiment of the disclosure. A substrate 20 at least having a first region A1 with plural first fins 211 extending along a first direction D1 and a second region A2 with plural second fins 212 extending along a second direction D2 is provided. In this example, the first direction D1 (such as X-direction) is perpendicular to the second direction D2 (such as Y-direction). Also, in one example, the first region A1 is a cell region, and the second region A2 is a non-cell region. A material layer 22 is formed on the substrate 20 to cover the first fins 211 and the second fins 212 before performing a fin-remove process.

Figure 3:
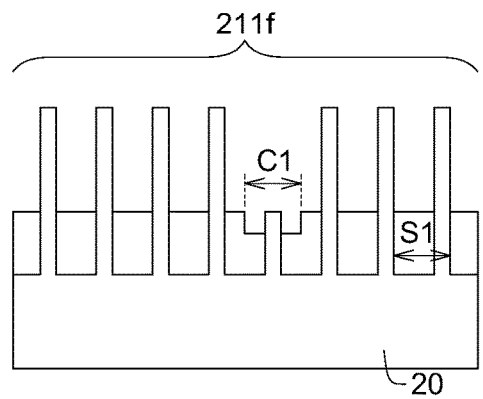
FIG. 3 is cross-sectional view along a cross-sectional line 3-3 in FIG. 2 showing the first fin features in the first region according to one exemplary embodiment of the disclosure.
Figure 4:
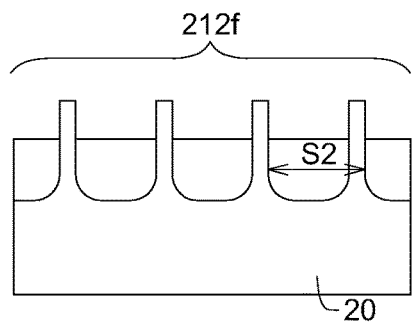
FIG. 4 is cross-sectional view along a cross-sectional line 4-4 in FIG. 2 showing the second fin features in the second region according to one exemplary embodiment of the disclosure.

In a fin-remove process, undesired portions of the fins are removed such as by etching to produce the desired fin features in the related regions. FIG. 3 is cross-sectional view along a cross-sectional line 3-3 in FIG. 2 showing the first fin features in the first region. FIG. 4 is cross-sectional view along a cross-sectional line 4-4 in FIG. 2 showing the second fin features in the second region. Please refer to FIG. 2-FIG. 4. When a fin-remove process is performed, the first fins 211 and the second fins 212 are identically patterned using a first pattern P1 and a second pattern P2 on the material layer 22 respectively for simultaneously removing parts of the first fins 211 and parts of the second fins 212, thereby forming the first fin features 211f in the first region A1 (FIG. 3) and the second fin features 212f in the second region A2 (FIG. 4). Also, during the fin-remove process, the first pattern P1 has a first dimension C1 along the second direction D2 (e.g. Y-direction), the second pattern P2 has a second dimension C2 along the second direction D2, and the second dimension C2 is equal to the first dimension C1 according to the embodiment of the disclosure. In one example, the first fins 211 and the second fins 212 are etched simultaneously. After the fin-remove process, the first fin features 211f as formed in the first region A1 can be monitored by using the second fin features 212f formed in the second region A2.

In one exemplary example, a photoresist (PR) pattern with a special critical dimension is formed on the material layer 22, and the PR pattern comprises the first pattern P1 corresponding to the first fins 211 in the first region A1 and the second pattern P2 corresponding to the second fins 212 in the second region A2, wherein the material layer 22, the first fins 211 and the second fins 212 are etched through the PR pattern to form the first fin features 211f in the first region A1 and the second fin features 212f in the second region A2.

Moreover, it is preferably to select the second fins 212 arranged appropriately to produce the second fin features 212f subsequently; for example, the pitch of the second fins 212 is larger than the pitch of the first fins 211. Please refer to FIG. 2-FIG. 4. In one embodiment, the first fins 211 have a first fin CD pitch S1, and the second fins 212 have a second fin CD pitch S2, wherein the second fin CD pitch S2 is larger than the first fin CD pitch S1, as shown in FIG. 2. In another embodiment, the second fin CD pitch S2 of the second fins 212 is greater than two times of the first fin CD pitch S1 of the first fins 211 (e.g. S2>2*S1). Accordingly, the second fin features 212f can be completely formed in the second region A2 after exposing, developing and etching procedures, thereby producing a completed pattern of the second fin features 212f in the second region A2 for monitoring the first fin features 211f in the first region A1.

Figure 5A:
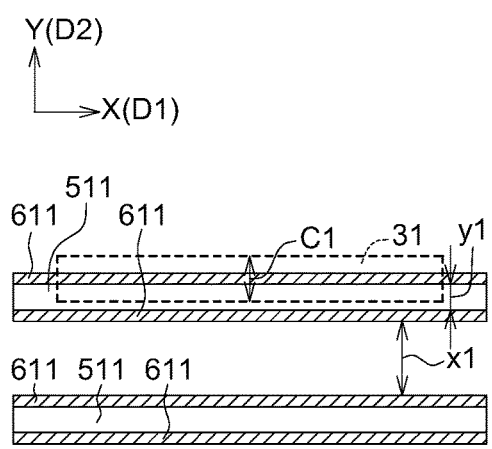
FIG. 5A simply depicts the first mandrels with the first spacers at the sidewalls thereof in a first region of a substrate according to one exemplary embodiment of the disclosure.
Figure 5B:
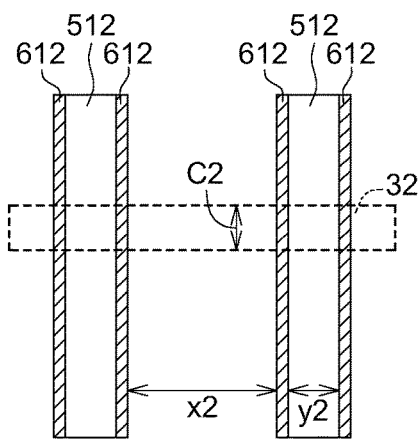
FIG. 5B simply depicts the second mandrels with the second spacers at the sidewalls thereof in a second region of the substrate according to one exemplary embodiment of the disclosure.

Additionally, it is known that the fins can be formed by different methods, and one of the known methods is that the fins defined by the spacers at the sidewalls of the mandrels. In one example applied by the present disclosure, the arrangements and dimensions of the mandrels and the spacers for creating the second fin features later can be determined and designed, such as having sufficient distances, in order to form a monitoring pattern with complete configuration. FIG. 5A simply depicts the first mandrels 511 with the first spacers 611 at the sidewalls thereof in a first region A1 of a substrate according to one exemplary embodiment of the disclosure, and FIG. 5B simply depicts the second mandrels 512 with the second spacers 612 at the sidewalls thereof in a second region A2 of the substrate according to one exemplary embodiment of the disclosure. After removing the first mandrels 511 and the second mandrels 512, the patterns of the first spacers 611 and the second spacers 612 are transferred to the substrate below for forming the first fin 211 and the second fins 212 as described above (e.g. FIG. 2). In one example, if the first mandrel 511 has a first width y1 along the second direction D2 (e.g. Y-direction) and the adjacent first spacers 611 for creating a pattern of the first fins (e.g. in a cell region) are spaced apart by a first distance x1, it can be designed that the second mandrel 512 has a second width y2 along the second direction D2 and the adjacent second spacers 612 for creating a pattern of the second fins (e.g. in a non-cell region) are spaced apart by a second distance x2, wherein the second width y2 is equal to or larger than twice of the first width y1 (i.e. y2≥2×y1), the second distance x2 is equal to or larger than twice of the first distance x1 (i.e. x2≥2×x1) for forming a monitoring pattern with complete configuration.

Figure 6A:
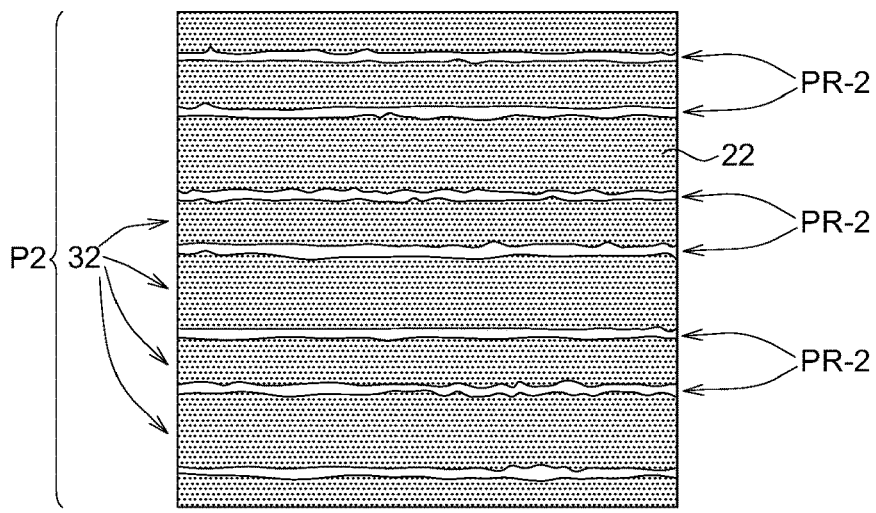
FIG. 6A is an after-develop-inspection (ADI) SEM image of one exemplary second pattern related to the second region according to one embodiment of the disclosure.
Figure 6B:
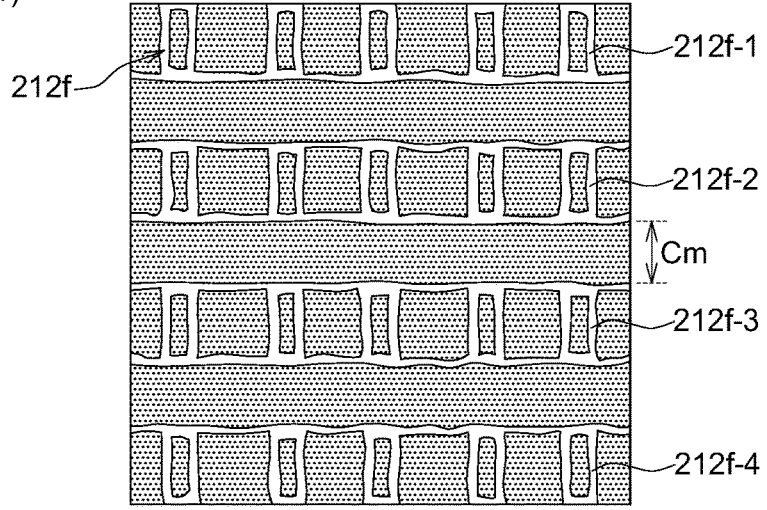
FIG. 6B is an after-etching-inspection (AEI) SEM image of the exemplary second pattern related to the second region of FIG. 6A.

According to the embodiment, after forming the second fin features 212f, a monitoring critical dimension (such as Cm in FIG. 6B) along the second direction D2, defined by a minimum distance between two of the second fin features positioned adjacently along the second direction D2, can be obtained by using an adequate measuring tool, such as a scanning electron microscopy (SEM). FIG. 6A is an after-develop-inspection (ADI) SEM image of one exemplary second pattern related to the second region according to one embodiment of the disclosure. A second pattern P2, comprising a photoresist parts PR-2 and one or more second removing portions 32 extending along the first direction D1, is provided above the second fins 212, wherein the second fins 212 underlying the second pattern P2 and extended along the second direction D2 are covered by an material layer 22 and not shown in FIG. 6A. FIG. 6B is an after-etching-inspection (AEI) SEM image of the exemplary second pattern related to the second region of FIG. 6A. After etching, the second fins extending along the second direction D2 underlying the material layer 22 in FIG. 6A have been cut through one or more second removing portions 32 (extending along the first direction D1) of the second pattern P2, so as to form the second fin features 212f, as shown in FIG. 6B. According to the embodiment, a minimum distance between two of the second fin features 212f positioned adjacently along the second direction D2 (such as a minimum distance between the second fin features 212f-2 and 212f-3) after etching is defined as a monitoring critical dimension Cm along the second direction D2. The monitoring critical dimension Cm as obtained, such as by a scanning electron microscopy (SEM), can be used for determining whether the removing CD of the first fins is adequate (i.e. not too large or too small).

According to the embodiment, the step of monitoring the first fin features using the second fin features comprises: obtaining a monitoring critical dimension Cm of the second fin features 212f in the second region A2; and comparing a pre-determined critical dimension (e.g. $C_{p-det}$) to the monitoring critical dimension Cm, wherein the pre-determined critical dimension (e.g. $C_{p-det}$) is an ideal critical dimension for the first fin features 211f in the first region A1.

Additionally, the method of an embodiment further comprises: feed-backing a comparing result of the monitoring critical dimension Cm to a lithography process. In one example, if the monitoring critical dimension Cm of the second fin features 212f is not equal to the pre-determined critical dimension (ex: $C_{p-det}$) for the first fin features 211f in the first region A1, a design of fin-remove critical dimension can be further adjusted, and/or re-creating a mask having the pre-determined critical dimension or a modified critical dimension.

Figure 7:
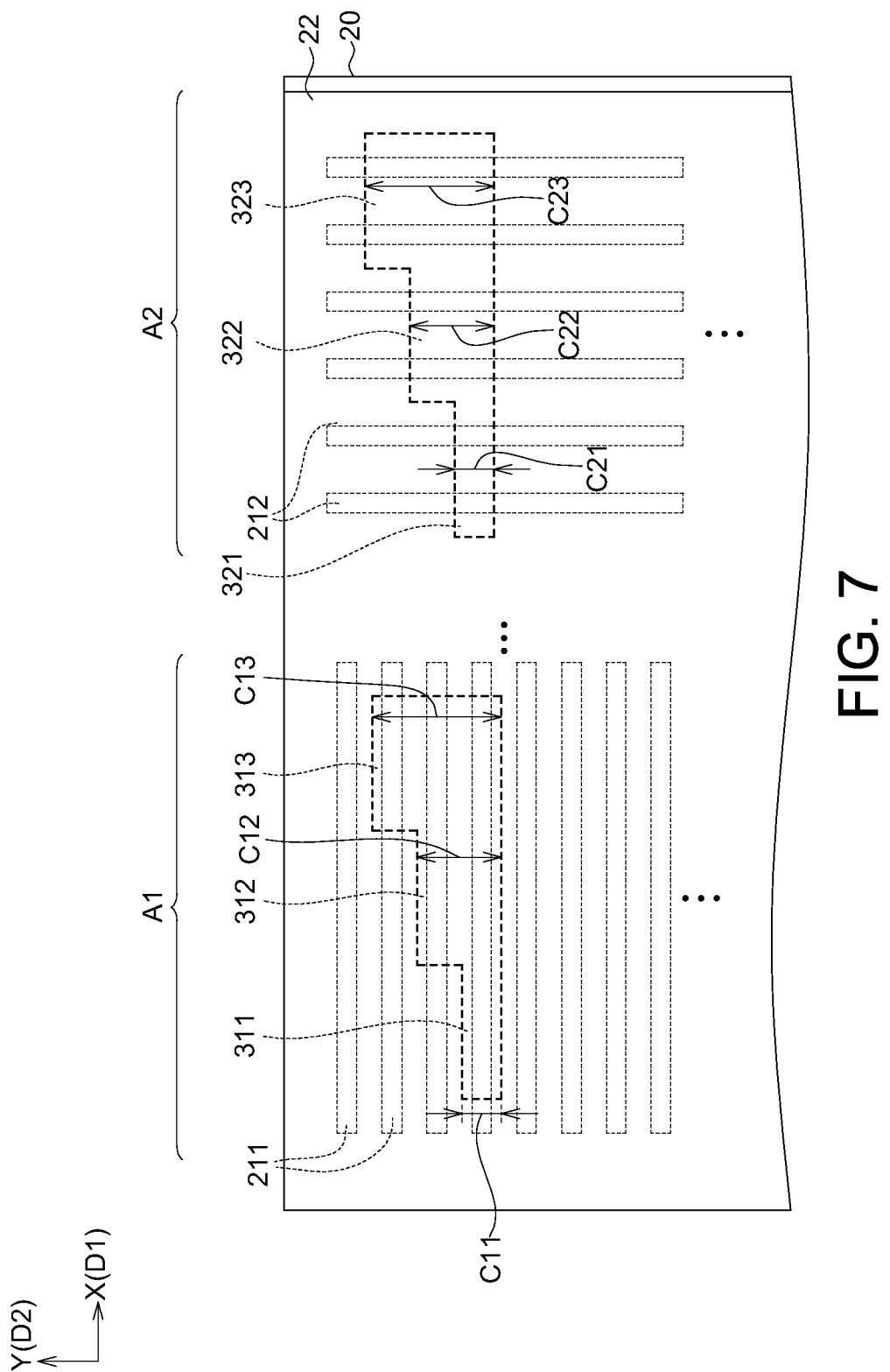
FIG. 7 is a top view schematically showing a semiconductor structure applied in a fin-remove process according to another exemplary embodiment of the disclosure.

Although FIG. 2 illustrates the first pattern P1 comprises a first removing portion 31 extending along the first direction D1 and the second pattern P2 comprises a second removing portion 32 extending along the first direction D1, the disclosure is not limited thereto. In some embodiments, each of the first pattern P1 and the second pattern P2 formed for removing undesired portions of the first fins 211 and the second fins 212 positioned underlying may comprise two or more removing portions with the same or different critical dimensions along the second direction D2 for monitoring the target fin features in the target region (e.g. the first fin features in the cell region), depending on the requirements of actual applications. FIG. 7 is a top view schematically showing a semiconductor structure applied in a fin-remove process according to another exemplary embodiment of the disclosure. The identical or similar elements of FIG. 7 and FIG. 2 are designated with the same or similar reference numerals for the purpose of clear illustration.

As shown in one exemplary configuration in FIG. 7, a substrate 20 at least having a first region A1 (such as a cell region) with plural first fins 211 extending along a first direction D1 and a second region A2 (such as a non-cell region) with plural second fins 212 extending along a second direction D2 is also provided, wherein the first direction D1 (such as X-direction) is perpendicular to the second direction D2 (such as Y-direction). The first fins 211 and the second fins 212 are covered by a material layer 22, and a PR pattern comprising the first and second patterns is formed on the material layer 22 for simultaneously removing undesired portions of the fins within the first and second regions in the subsequent procedures. The first pattern corresponding to the first fins 211 positioned underlying comprises two or more of the first removing portions (such as the first removing portions 311, 312 and 313) extending along the first direction D1, and the first removing portions 311, 312 and 313 have different opening dimensions C11, C12 and C13 along the second direction D2. That is, the opening dimensions C11≠C12≠C13. Similarly, the second pattern corresponding to the second fins 212 positioned underlying at least comprises two or more of the second removing portions (such as the second removing portions 321, 322 and 323) extending along the first direction D1, and the second removing portions 321, 322 and 323 have different opening dimensions C21, C22 and C23) along the second direction D2. That is, the opening dimensions C21≠C22≠C23. According to the embodiment, the opening dimension C11 of the first removing portion 311 is equal to the opening dimension C21 of the second removing portion 321, the opening dimension C12 of the first removing portion 312 is equal to the opening dimension C22 of the second removing portion 322, the opening dimension C13 of the first removing portion 313 is equal to the opening dimension C23 of the second removing portion 323. After fin-removing step, the first fins 211 in the first region A1 are etched by the first pattern (such as the first removing portions 311, 312 and 313) by removing undesired fins to form the first fin features, and the second fins 212 in the second region A2 are etched by the second pattern (such as the second removing portions 321, 322 and 323) to form the second fin features, wherein a minimum distance between two of the second fin features positioned adjacently along the second direction D2, determined as a monitoring critical dimension Cm along the second direction D2 (as described above; FIG. 6B), is obtained to compare with a pre-determined critical dimension of the first fin features in the first region to monitor the first fin features.

It is noted that the first removing portions 311, 312 and 313 positioned adjacently as shown in FIG. 7 are only depicted for simple illustration, not for limitation; they can be formed in any positions in the first region, depending on the actual design of fin removal in the practical applications. The second removing portions 321, 322 and 323 are not limited to be positioned adjacently as shown in FIG. 7, and the relative positions of the second removing portions 321, 322 and 323 can be determined according to the relative positions of the first removing portions 311, 312 and 313. Configuration, arrangement and the dimensions of the related elements/components/layers such as the first and second fins, the first and second removing portions, and as shown in the exemplary drawings (e.g. FIG. 2, FIG. 7) are provided for illustration. It will thus be appreciated that those skilled in the art will be able to devise various configurations, arrangements and the dimensions of the related elements/components/layers which, although not explicitly described or shown herein, embody the principle of the disclosure and are included within its spirit and scope.

In one embodiment, the first fin features 211f (as shown in FIG. 3) can be a main pattern of the fins in the cell region before a fin-cut process. In one practical application, two masks can be conducted for removing and cutting unwanted parts or sections of the fins. A fin-remove process (such as using a first mask) is conducted for removing fins with small critical dimensions. A fin-cut process (such as using a second mask) is conducted for cutting the fins with large critical dimensions. The present disclosure is suitable but not limited for being applied in the fin-remove process.

According to the aforementioned descriptions, a method for monitoring the removal of the fins by forming a monitoring pattern is provided. A fin-removing critical dimension for forming the target fin features in a target region (e.g. the first region) can be checked in an easier method by comparing a monitoring critical dimension (e.g. Cm) of the second fin features in a second region (different from a target region) with the fin-removing critical dimension of the target fin features in a first region. Thus, the pattern accuracy of the fin removal in the target region can be quickly confirmed and corrected if needed, which increases the production yield and saves the production cost of the semiconductor devices as manufactured.

Other embodiments with different configurations of known elements in the semiconductor devices can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications without departing from the spirit of the disclosure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for monitoring fin removal, comprising:
providing a substrate at least having a first region with first fins extending along a first direction and a second region with second fins extending along a second direction, wherein the first direction is perpendicular to the second direction;
forming a material layer on the substrate to cover the first fins and the second fins;
identically patterning the first fins and the second fins using a first pattern and a second pattern on the material layer respectively for simultaneously removing parts of the first fins and parts of the second fins, thereby forming first fin features in the first region and second fin features in the second region, wherein the first pattern has a first dimension along the second direction, the second pattern has a second dimension along the second direction, and the second dimension is equal to the first dimension; and
monitoring the first fin features using the second fin features.

2. The method according to claim 1, wherein a first fin critical dimension pitch of the first fins is smaller than a second fin critical dimension pitch of the second fins.

3. The method according to claim 1, wherein a second fin critical dimension pitch of the second fins is greater than two times of a first fin critical dimension pitch of the first fins.

4. The method according to claim 1, wherein the first region is a cell region, and the second region is an non-cell region.

5. The method according to claim 1, wherein after patterning, a monitoring critical dimension along the second direction, defined by a minimum distance between two of the second fin features positioned adjacently in the second region, is obtained.

6. The method according to claim 5, further comprising: comparing the monitoring critical dimension to an ideal critical dimension for the first fin features as predetermined.

7. The method according to claim 1, wherein a photoresist (PR) pattern with a special critical dimension is formed on the material layer, and the PR pattern comprises the first pattern corresponding to the first fins and the second pattern corresponding to the second fins, wherein the material layer, the first fins and the second fins are etched through the PR pattern to form the first fin features in the first region and the second fin features in the second region.

8. The method according to claim 1, wherein the first pattern comprises a first removing portion extending along the first direction and corresponding to the first fins positioned underlying; and the second pattern comprises a second removing portion extending along the first direction and corresponding to the second fins positioned underlying.

9. The method according to claim 1, wherein during the identically patterning step, the first fins in the first region are etched through the first pattern to form the first fin features, and the second fins in the second region are etched through the second pattern to form the second fin features, wherein a minimum distance between two of the second fin features positioned adjacently along the second direction after etching is defined as a monitoring critical dimension along the second direction.

10. The method according to claim 9, wherein the step of monitoring the first fin features using the second fin features comprises:
obtaining the monitoring critical dimension of the second fin features in the second region; and
comparing a pre-determined critical dimension to the monitoring critical dimension, wherein the pre-determined critical dimension is an ideal critical dimension for the first fin features in the first region.

11. The method according to claim 10, further comprising: feed-backing a comparing result of the monitoring critical dimension to a lithography process.

12. The method according to claim 10, wherein if the monitoring critical dimension is not equal to the pre-determined critical dimension, the method further comprises: adjusting a design of fin-remove critical dimension and re-creating a mask having the pre-determined critical dimension.

13. The method according to claim 1, wherein the first pattern corresponding to the first fins positioned underlying at least comprises two first removing portions extending along the first direction, and the two first removing portions have different opening dimensions along the second direction.

14. The method according to claim 13, wherein the second pattern corresponding to the second fins positioned underlying at least comprises two second removing portions extending along the first direction, and the two second removing portions have different opening dimensions along the second direction.

15. The method according to claim 14, wherein the two first removing portions have a first opening dimension and a second opening dimension along the second direction, and the first opening dimension is different from the second opening dimension;

the two second removing portions have a third opening dimension and a fourth opening dimension along the second direction, and the third opening dimension is different from the fourth opening dimension, wherein the third opening dimension is equal to the first opening dimension, and the fourth opening dimension is equal to the second opening dimension.

* * * * *